US008899887B2

(12) United States Patent
Kosmowski et al.

(10) Patent No.: US 8,899,887 B2
(45) Date of Patent: Dec. 2, 2014

(54) DRILLING APPARATUS WITH A DECOUPLED FORCE FRAME AND METROLOGY FRAME FOR ENHANCED POSITIONING

(71) Applicants: Mark Kosmowski, Tigard, OR (US); Wojciech B. Kosmowski, San Juan Capistrano, CA (US)

(72) Inventors: Mark Kosmowski, Tigard, OR (US); Wojciech B. Kosmowski, San Juan Capistrano, CA (US)

(73) Assignee: Interdyne Systems Inc. (KY)

( * ) Notice: Subject to any disclaimer, the term of this patent is extended or adjusted under 35 U.S.C. 154(b) by 26 days.

(21) Appl. No.: 13/766,337

(22) Filed: Feb. 13, 2013

(65) Prior Publication Data

US 2014/0227056 A1    Aug. 14, 2014

(51) Int. Cl.
*B23B 41/00* (2006.01)
*B23B 41/14* (2006.01)
*B23B 47/00* (2006.01)

(52) U.S. Cl.
CPC ..................... *B23B 47/00* (2013.01)
USPC ............... 408/91; 408/129; 408/234; 408/53

(58) Field of Classification Search
CPC .......... B23B 41/00; B23B 41/14; B23B 41/16
USPC .......... 408/53, 87, 88, 91, 129, 234; 409/202, 409/141; 173/2, 4, 217, 171; 108/20, 143
See application file for complete search history.

(56) References Cited

U.S. PATENT DOCUMENTS 3,753,384 A * 8/1973 Anfindsen ............... 409/293
5,584,788 A * 12/1996 Piovano .................. 483/37
6,227,777 B1 * 5/2001 Kosmowski ............... 409/231
6,280,124 B1 * 8/2001 Ammann ................. 408/129
7,029,214 B2 * 4/2006 Shiba et al. ............... 409/241
8,297,892 B2 * 10/2012 Alvarez Serrano ........ 409/159
2001/0002380 A1 * 5/2001 Tominaga et al. ........... 483/55
2002/0149279 A1 * 10/2002 Bartolotti ................. 310/114
2004/0090126 A1 * 5/2004 Hsu et al. .................. 310/12
2004/0223824 A1 * 11/2004 Kuo ........................ 409/235
2005/0053434 A1 * 3/2005 Suzuki et al. .............. 408/97
2008/0289440 A1 * 11/2008 Denk et al. ............... 74/89.34
2010/0236802 A1 * 9/2010 Berger et al. .............. 173/118

FOREIGN PATENT DOCUMENTS

| JP | 04-354196 A | * | 12/1992 | ............. B65H 5/04 |
| JP | 05-169352 A | * | 7/1993 | ............. B23Q 15/22 |
| JP | 07-171796 A | * | 7/1995 | ............. B23B 41/00 |
| JP | 08-155894 A | * | 6/1996 | ............. B23B 41/00 |
| JP | 09-248724 A | * | 9/1997 | ............. B23B 41/00 |
| JP | 10-029133 A | * | 2/1998 | ............. B23B 41/00 |
| SU | 1465177 A | * | 3/1989 | ............. B23B 39/00 |

* cited by examiner

*Primary Examiner* — Andrea Wellington
*Assistant Examiner* — Ryan Rufo
(74) *Attorney, Agent, or Firm* — Mark S. Hubert

(57) ABSTRACT

A printed circuit board (PCB) drilling apparatus that greatly increases the speed, accuracy and depth of the drilling process as well as increasing the life of the drill bits by decoupling the reactionary forces encountered in the positioning and drilling functions of the apparatus in the x, y and z axes from the components that accomplish the positioning, measuring and drilling of the stacked printed circuit boards. The part of the apparatus that moves and drills as well as the feedback position sensors are mounted to a set of vibration isolation pads that absorb the vibrations that would disturb the feedback sensors. Additionally, the force frame of the apparatus that experiences the reactionary force movements are decoupled from the metrology frame of the apparatus that house the feedback sensors, also increasing the throughput and accuracy.

14 Claims, 9 Drawing Sheets

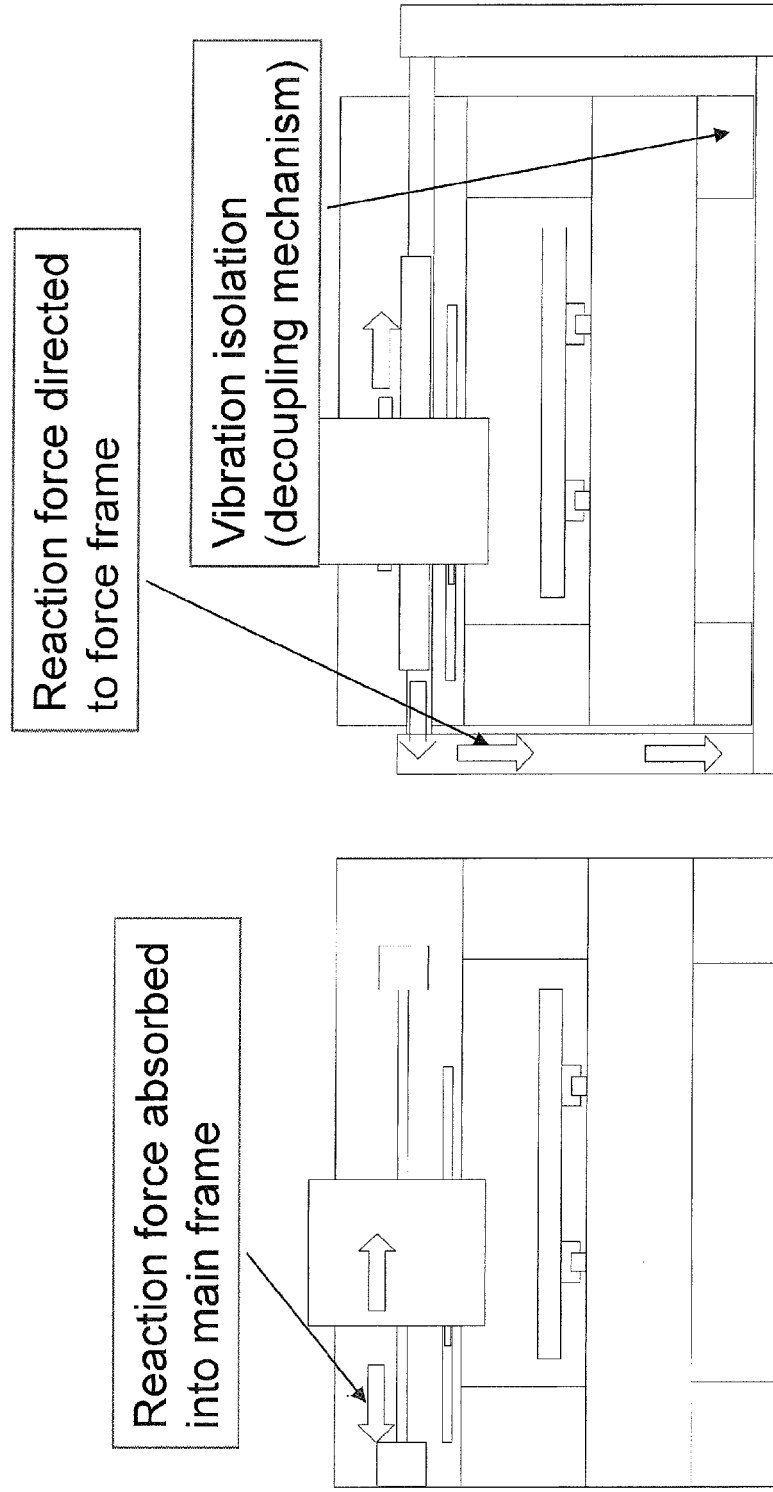

DRILLING APPARATUS WITH A DECOUPLED FORCE FRAME AND METROLOGY FRAME FOR ENHANCED POSITIONING

The present invention involves a novel design for a printed circuit board (PCB) substrate drilling machine that greatly increases the speed, accuracy and depth of the drilling process as well as increasing the life of the drill bits.

BACKGROUND OF THE INVENTION

There is a huge industry developed around the demand to drill multiple, spaced holes (through or non-through) in substrates such as electronic wafers, thin film electronics, organic packaging substrates, glass, silicon wafers, sapphires or the like. These holes or patterned drillings may be used for electrical connections, filtration, cytology, bioassays, chemotaxis, or particle monitoring and have diameters that commonly lie in the micron range. Not only must the holes be identical to each other in diameter but also must be placed at precise locations and with the right geometry with respect to the substrate or adjacent holes.

Generally, such drilling machines see movement in all three axes simultaneously. The substrate is positionally moved in the horizontal x axis beneath a drill that plunges in the z vertical axis after the drill has been positionally moved in the Y horizontal axis atop the substrate by a gantry unit. Drilling is initiated once the substrate is in the proper position as indicated by a set of metrology positioning sensors on the machine and at least one pressure foot has secured the PCB substrate on the x axis table to the z axis drill unit. This positioning prior to drilling occurs extremely rapidly by computer control, cycling up to thousands of times per minute. Pursuant to Newton's third law of motion, each of these three positioning or drilling movements creates a reactionary force in the structure of the PCB substrate drilling machine. Since it is this machine that metrology positioning sensors are coupled to, the settling time or lag for the PCB substrate to be positioned within the acceptable ranges of the feedback sensors is slowed by the effects of the reactionary forces, thus slowing the positioning process and adding slight inaccuracies in the positioning and eventual placement of the holes in the PCB.

Prior art PCB substrate drilling systems rely on the use of a massive, heavy machine base to minimize these reactionary forces coupled with light moving masses, however, these reactionary forces still inherently reside in the machine and serve to limit the speed and accuracy at which the machine can function. When drilling micro holes or vias of 100 microns or less in diameter at a rates higher than 15 cycles per second, the positioning accelerations increase to meet the point to point positioning commands and the disturbances that are injected into the heavy machine base cause the settling time at the end of each positioning to become longer thus cancelling out any move time reduction gained by the improved acceleration of the lighter moving masses. Additionally, the sensors operate with moderately large settling windows (in the 0.1 micron range) in the x and y axes. These prior art solutions that increase the mass of the machine base (reaction mass) and make the moving masses lighter do not completely address the root cause of the problem—that the unitary base design supports both the metrology system and the drilling system.

Henceforth, a PCB substrate drilling machine with improved accuracy and speed, faster and deeper drilling depth (increased PCB substrate stack heights), longer drill bit life, less drill bit breakage and a higher machine throughput would fulfill a long felt need in the substrate drilling and surface patterning industry. This new invention utilizes and combines known and new technologies in a unique and novel configuration to overcome the aforementioned problems and accomplish this.

SUMMARY OF THE INVENTION

The present invention, which will be described subsequently in greater detail, relates to a PCB substrate drilling apparatus adapted to provide both speed and accuracy for the user resulting in a higher throughput. More particularly, to a PCB substrate drilling apparatus that decouples any reactionary forces from the x axis and y axis positioning away from the measurement and positioning components, and balances the z axis drilling forces of the apparatus so as to enable a much more efficient operation capable of drilling a larger stack of PCB substrates. It has many of the advantages mentioned heretofore and many novel features which are not anticipated, rendered obvious, suggested, or even implied by any of the prior art, either alone or in any combination thereof.

In accordance with the invention, an object of the present invention is to provide an improved PCB substrate drilling apparatus having a decoupled force frame and metrology frame to enable enhanced positioning and drilling.

It is another object of this invention to provide an improved PCB substrate drilling apparatus capable of surpassing the current number of stacked PCB substrates that can be drilled at the same time and remain within operational tolerances.

It is a further object of this invention to provide a PCB substrate drilling apparatus that maximizes the life of the drill bits and increases the precision of the location of the drilled holes.

It is still a further object of this invention to provide for a PCB substrate drilling apparatus that minimizes or eliminates all reactionary force effects from the positioning and drilling functions that are created by the apparatuses' moving components.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements. Other objects, features and aspects of the present invention are discussed in greater detail below.

There has thus been outlined, rather broadly, the more important features of the invention in order that the detailed description thereof that follows may be better understood and in order that the present contribution to the art may be better appreciated. There are, of course, additional features of the invention that will be described hereinafter and which will form the subject matter of the claims appended hereto.

BRIEF DESCRIPTION OF THE DRAWINGS

FIG. 1 is a front view of a prior art PCB substrate drilling apparatus illustrating the operational and reactionary forces;

FIG. 2 is a front view of the PCB substrate drilling apparatus of the present invention illustrating the separation of the operational and reactionary forces;

DETAILED DESCRIPTION

Figure 3:
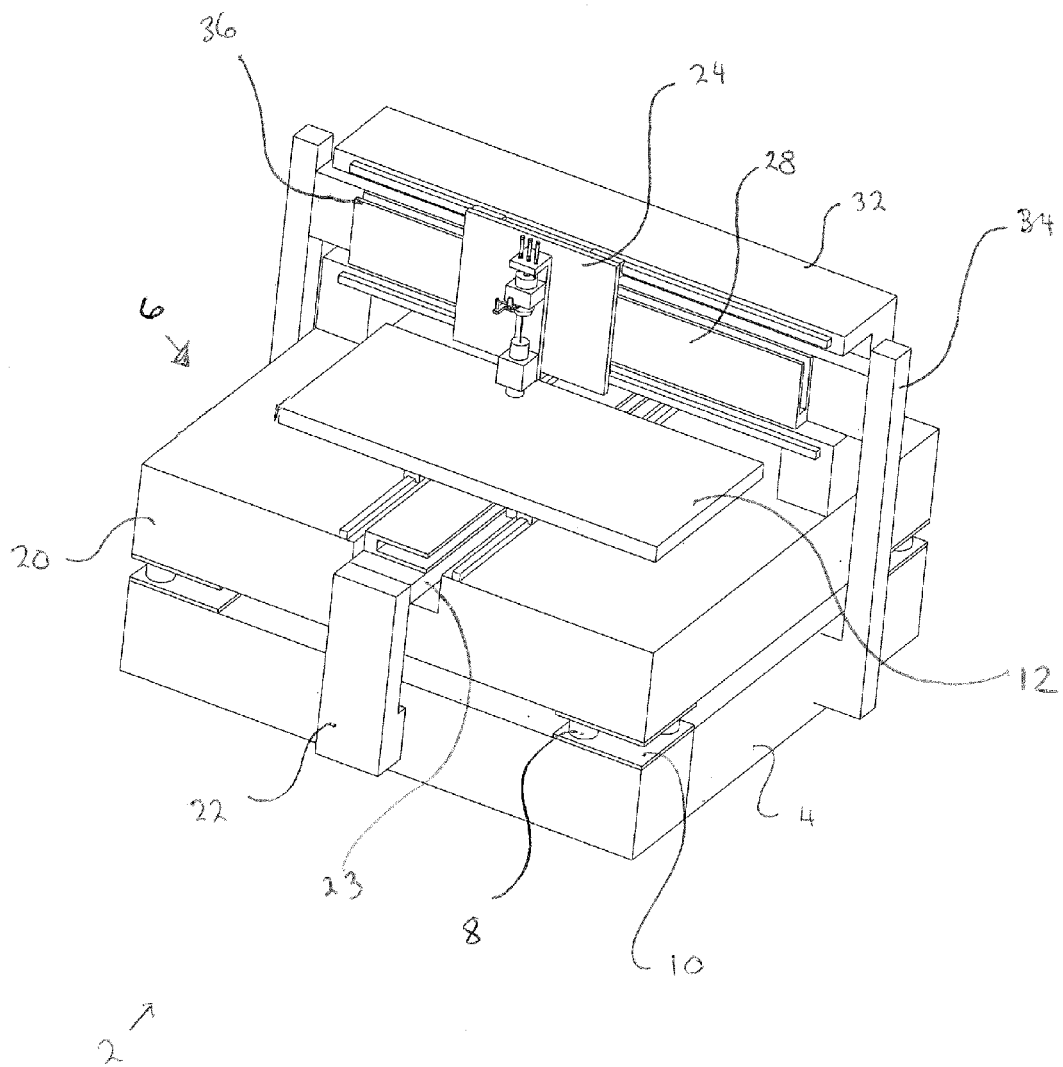
FIG. 3 is a perspective view of the PCB substrate drilling apparatus.
Figure 4:
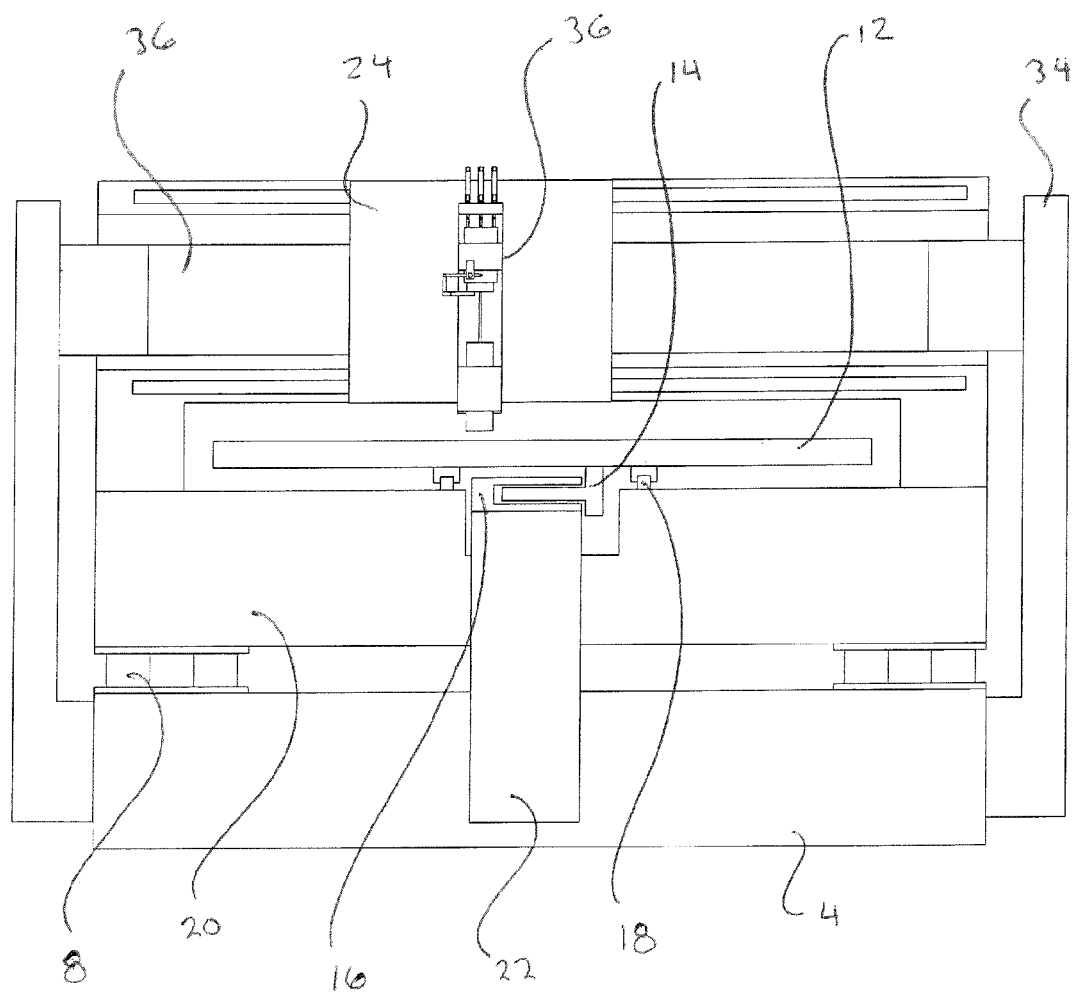
FIG. 4 is a front view of the PCB substrate drilling apparatus.
Figure 5:
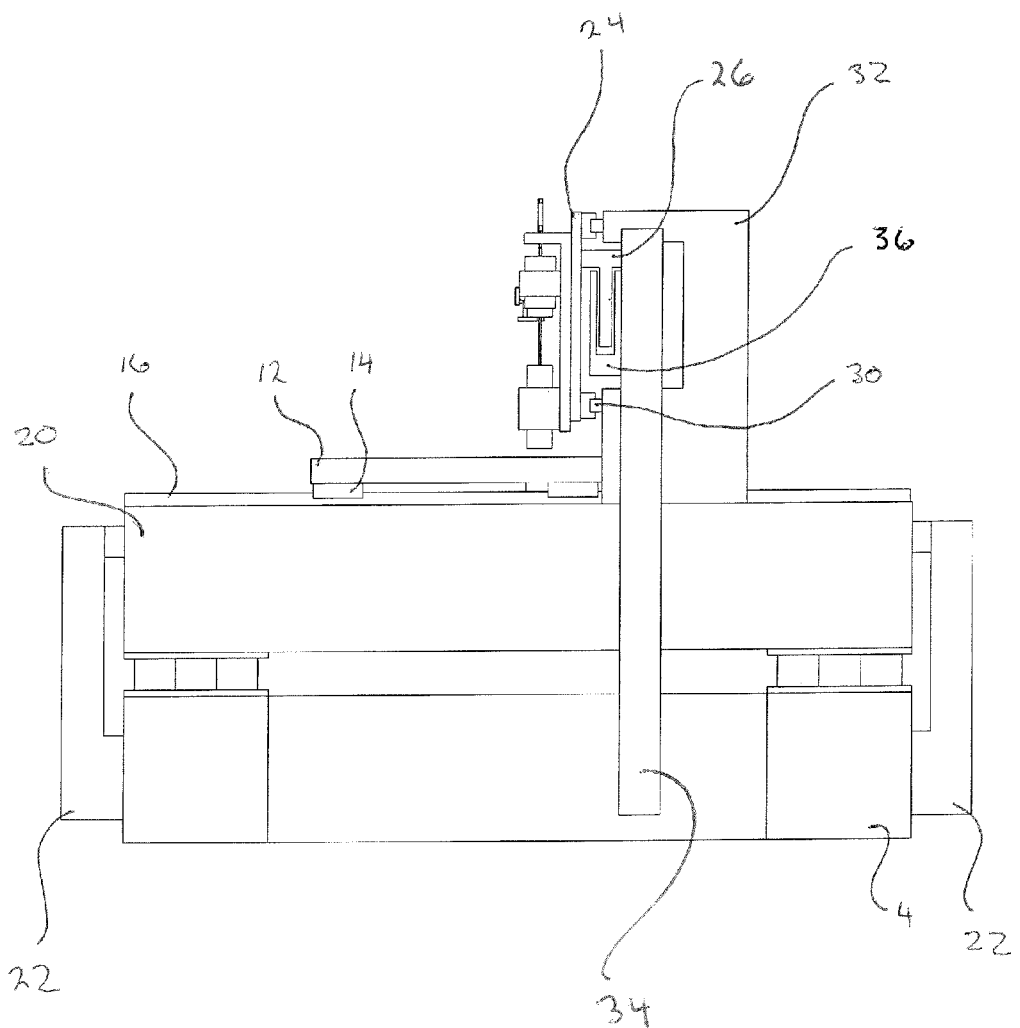
FIG. 5 is a side view of the PCB substrate drilling apparatus.
Figure 6:
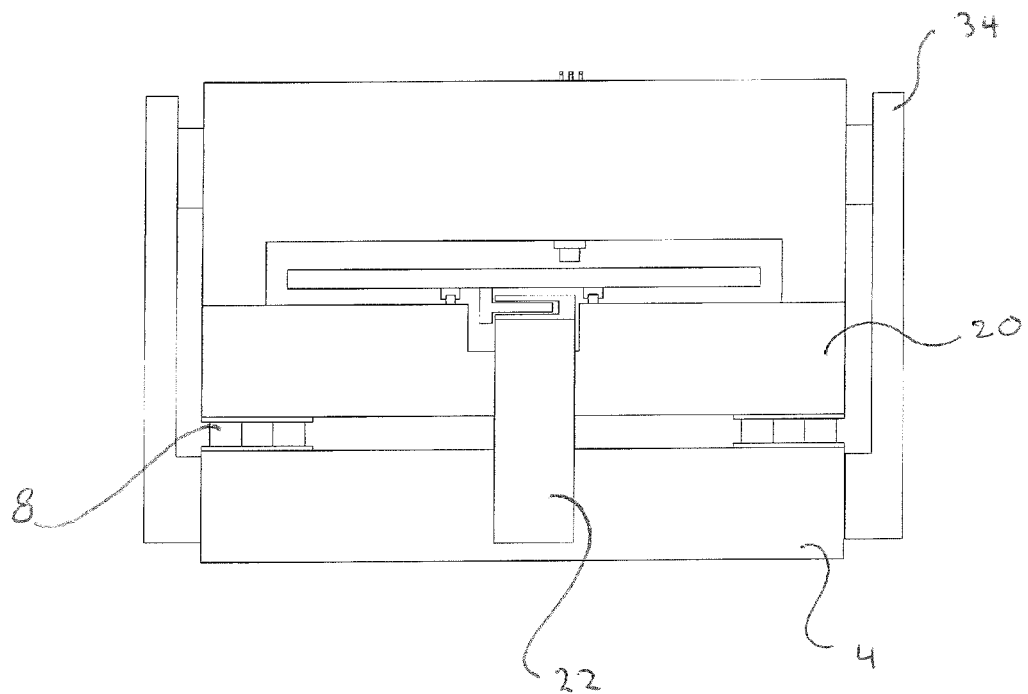
FIG. 6 is a back view of the PCB substrate drilling apparatus.
Figure 7:
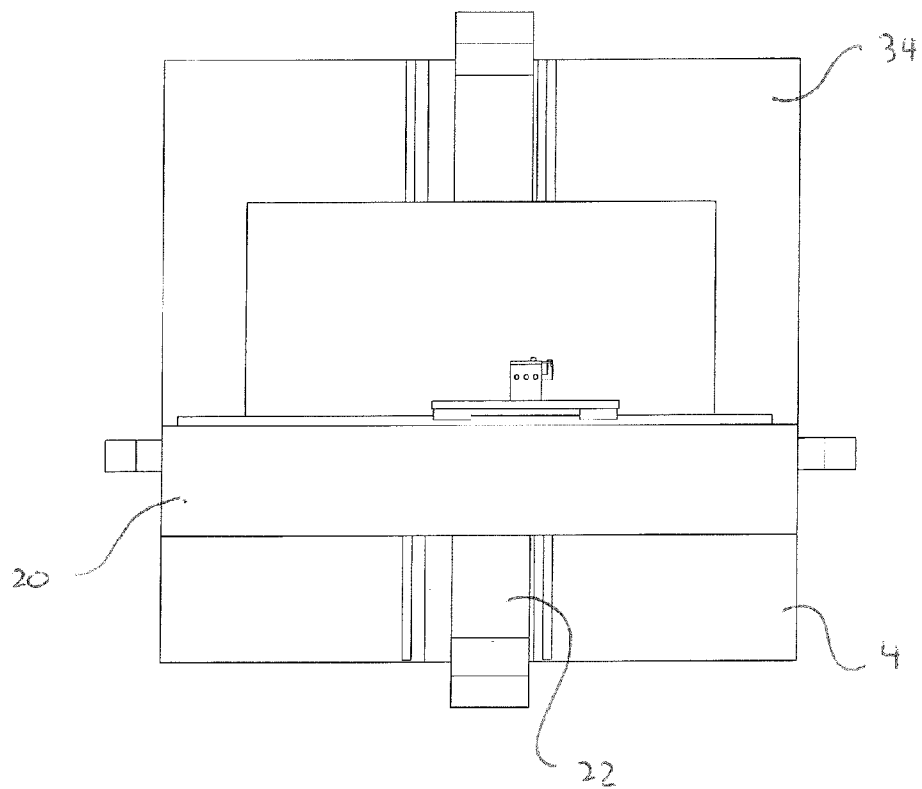
FIG. 7 is a top view of the PCB substrate drilling apparatus.

All discussion of the geometry involved in describing the present invention is made with reference to a three dimensional Cartesian Coordinate System where the z axis is vertical and pointing up (positive up), so that the x and y axes lie on a horizontal plane where the x axis is shown as positive pointing "out of the page" towards the viewer, and the y axis is shown as positive on the right side of the z axis.

Generally, PCB substrate drilling machines perform four functions: staging (positioning) of the PCB substrates to be drilled in the correct x axis location on their moveable table, locating the drilling unit in the correct y axis location above the PCB substrate stacks on the moveable table; feedback sensor measurement and verification of the location of the moveable table in relation to the drilling unit; and plunging the drill bit in the z axis into the stacked PCB substrates. In the prior art devices, the measurement function (metrology) is accomplished by position feedback sensors located on the same frame of the device that accomplishes the positioning and drilling. This frame has a huge mass base, generally a planar granite or cement slab, into which the reactionary forces of the positioning and drilling functions is passed. Its large mass minimizes any reactionary force movement that is experienced by this slab, thereby passing very little of these reactionary forces onto the actual positioning, measuring and drilling components. This has several benefits. First, it minimizes the settling time of the positioning feedback sensors (the time after the positioning of the moveable table is completed until the sensor sees no further movement or backlash and can initiate the signal to begin the drilling.) Second, it prevents any additional, unwanted movement of the x axis movable table, the y axis moveable trolly and the z axis drilling unit which will reduce the accuracy of the PCB stack location. Third, and lastly, it helps ensure that the drill bits enter the PCB board stacks at precisely 90 degrees and thus do not drift too far off of their desired mark on the bottom PCB substrate.

Albeit, these reactionary force movements are minimized with this fix—but not neglible. While these unwanted movements may have been acceptably minimized with large scale drilling, this is not the case with PCB substrate holes which are in the 10-100 micron range. In this huge mass base or frame, the reaction forces when absorbed, turn into low accelerations and one must hope the position feedback sensors are not disturbed at a frequency that will cause a loss in system accuracy. The primary reason why this heavy base design is so prominent is because of the prominent the use of ball screw drives. However, with the advent of cost competitive linear motors it is now possible to make a machine tool architecture that utilizes the decoupled force frame/metrology frame architecture.

Total elimination of these reactionary force movements would drastically improve the operation of such devices. The present apparatus deals with the removal of these reactionary force movements in all axes in two ways that result in a new apparatus architecture. First, the present apparatus separates or decouples the apparatus into two frames—a force frame to accept the x axis and y axis reactionary forces, and a metrology frame that houses the feedback sensors used to position the PCB substrate stacks for drilling. The importance of keeping the reactionary force movements from disturbing position feedback is critical, for the feedback sensor unit is only as good as the environment it is in. If the frame that the feedback sensor encoders are positioned on has extensive vibrations, it will lose its ability to properly measure the x, y and z axis positions of the apparatus' components as indicated by the encoding strips. (Although, generally position feedback is done by a feedback sensor unit that has an encoding strip and an optical encoder that senses the encoding stip, it is know that other position feedback sensor units may be utilized with this present invention.) Second, it utilizes a balanced reactionary force drill unit that passes no reactionary forces from the downward and upward stroke of the drill spindle onto the metrology frame. The combination of these fixes eliminates all of the movement from reactionary forces in all three axes resulting in shorter cycle times (due to quicker positioning sensor settling times), less drill bit wear and breakage (due to precise 90 degree drilling geometry), higher multiple PCB substrate stacks (due to less drill bit wander.)

Simply stated, the output of the present invention far exceeds that of the prior art and provides a much more accurately positioned hole on the PCB substrates. FIG. 1 illustrates the operational concept of the prior art and FIG. 2 illustrates the operational concept of the present invention's decoupled force frame/metrology frame design that results in the enhanced machine stability.

It is to be noted that for the purposes of clarity the position feedback sensors, the drilling and drive computer, the pressure feet and the drill drive equipment are not illustrated as they are well known in the industry and their inclusion in the figures would just serve to hamper the clarity for the overall representation and understanding of the present invention. In the preferred embodiments, a zero impact pressure foot would be utilized as disclosed in EP 0266397 A4, EP 0461733 B1 and EP 0461733 A2.

Looking at FIGS. 3-7 the general arrangement of all components of the PCB substrate drilling apparatus (the apparatus) 2 can best be seen. A reactionary force frame base mass 4 made of a dense material such as granite, steel or concrete rests directly on the ground and serves to support the remainder of the apparatus's components. It generally weighs in the several ton range at a minimum. Actual weight varies with the size of the apparatus it is coupled to. It is separated from the metrology frame support base 20 by a set of vibration isolation dampeners 8. These dampeners serve two functions. They prevent any reactionary force motion or other vibrations from the base mass force frame 4 from being transmitted to the metrology frame support base 20 and table assembly 6, and they absorb any vibrations in the metrology frame support base 20 that would disturb the feedback sensors. These vibration isolation dampeners 8 are of an elastomeric polymer, although a metal spring or other compressible isolator that is well known in the industry could be substituted. The vibration isolation dampeners 8 may be mounted top and bottom on a set of plates 10 that are in turn affixed to the base mass force frame 4 and the metrology frame support base 20. Although depicted in sets of two and being located at the four corners of the assembly 2, the actual placement and number of isolation dampeners may vary depending upon the size and configuration of the assembly. Although not shown in the figures, in an alternate embodiment the isolation dampers are placed at the horizontal center of gravity plane of the metrology frame support base. The design illustrated in FIG. 3 would be modified such that the uppermost (top) plate of the pair of metal plates 10 would fit up into a stopped orifice in the metrology frame support base such that its vertical position was vertically aligned with the horizontal center of gravity plane for the metrology frame support base. The top of this stopped orifice would serve as the upper contact point between the metrology frame support base 20 and the isolation damper 8. This type of modification would be well known it the field of art. This aids to further eliminate any parasitic reactionary force disturbances.

The x axis moving table assembly 6 has an x axis moving table 12 coupled to the traveling arm 14 of the x axis linear drive unit. The x axis linear drive unit drives the traveling arm 14 along a stationary track 16 based on a signal generated by the master control computer. On this moving table 12 are located the encoding strips that enable the optical encoders mounted on the metrology frame support base 20 to determine the table's position and relay it to the computing means for generation of x axis drive signals to the x axis linear drive unit to move the traveling arm 14, as well as the stacks of PCB substrate for drilling, which are mounted on the traveling table 12. The x axis traveling arm 14 is coupled to the stationary drive track 16 of the x axis linear drive unit for linear motion in the x axis by a low friction bearing means. Additional low friction bearings 18 act as a support between the bottom face of the x axis moving table 12 and the top face of the metrology frame support base 20. The stationary drive track 16 is not coupled or connected to the metrology frame support base 20, rather the stationary drive track 16 of the x axis linear drive unit is directly coupled to the base mass force frame 4 by the x axis reactionary force movement transfer means 22. This is a stanchion made of a pair of rigid arms connected by a beam 23 made of a steel, a metal, a polymer or composite construction thereof, that the x axis stationary drive track 16 is affixed to. It is an extension of the base mass force frame 4. (Although it is known that the x axis reactionary force movement transfer means 22 may have a different physical configuration, it will remain a connection between the x axis stationary drive track 16 and the base mass force frame 4 and must isolate the x axis traveling arm 14 from the metrology frame support base 20. Since the base mass force frame 4 is directly coupled to the ground, connecting the x axis reactionary force movement transfer means 22 directly to the ground rather than to the base mass force frame is deemed the equivalent to connecting the x axis reactionary force movement transfer means 22 to the base mass force frame 4. This alternate method of design would be an alternate embodiment of the present invention.)

As the x axis moving table 12 and traveling support arm 14 of the linear drive unit move in the x axis, the reactionary force experienced in the x axis stationary drive track 16 of the linear drive unit is transmitted through the x axis reactionary force movement transfer means 22 to the base mass force frame 4 which is in turn transferred to the ground. It is known that in other embodiments the x axis reactionary force movement transfer means 22 may be of a single rigid arm and may be affixed differently to the stationary drive.

The y axis moving trolley assembly has a y axis moving carriage 24 coupled to the y axis travelling arm 26 of the y axis linear drive unit. The y axis linear drive unit drives the y axis moving carriage 24 along a y axis stationary (generally magnetic) drive track 28 based on a signal generated by the master control computer. This y axis traveling arm 26 is coupled to the y axis stationary drive track 28 for the y axis linear drive unit and is adapted for linear motion in the y axis by a low friction bearing means 30. Additional low friction y axis bearings 30 act as a support between the back face of the y axis moving trolley 24 and the front face of the metrology frame support base's y axis support block 32. The y axis support block is an extension of the metrology frame support base 20. (Although shown as a U shaped block projecting normally from the section of the metrology frame support base 20 that the traveling table 12 is supported on, it is known that any configuration that is capable of supporting the y axis moving trolley 24 could be substituted provided that it was isolated from the base mass force frame 4.)

The y axis stationary drive track 28 is decoupled from the metrology frame support base's y axis support block 32 (and the rest of the metrology frame support base 20) by virtue of its direct coupling to the base mass force frame 4 by the y axis reactionary force movement transfer means 34. This is a rigid stanchion made of pair of rigid arms with a planar member extending between them. It can be made of a steel, a metal, a polymer or composite construction thereof and it is connected to and supports the y axis stationary drive track 36. As the y axis moving carriage 24 and traveling arm 26 of the y axis linear drive unit move in the y axis, the reactionary force experienced in the y axis stationary drive track 28 of the y axis linear drive unit is transmitted through the y axis reactionary force movement transfer means 34 to the base mass force frame 4 which is in turn transferred to the ground. It is known that in other embodiments the y axis reactionary force movement transfer means 34 may employed. (Although it is known that the y axis reactionary force movement transfer means 34 may have a different physical configuration, it will remain a connection between the y axis stationary drive track 28 and the base mass force frame 4 and must isolate the y axis stationary drive 36 from the metrology frame force base 20. Since the base mass force frame 4 is directly coupled to the ground, connecting the y axis reactionary force movement transfer means 22 directly to the ground rather than to the base mass force frame 4 is deemed the equivalent to connecting the y axis reactionary force movement transfer means 32 to the base mass force frame 4. This alternate method of design would be an alternate embodiment of the present invention.)

Figure 8:
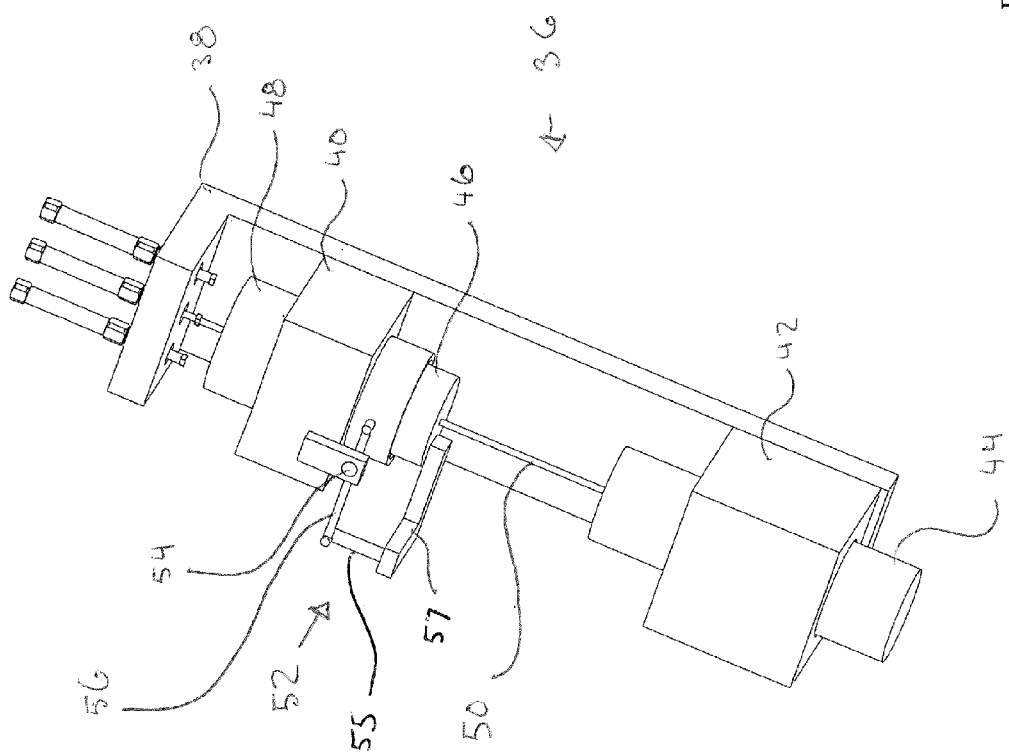
FIG. 8 is a perspective view of the z axis drill unit.
Figure 9:
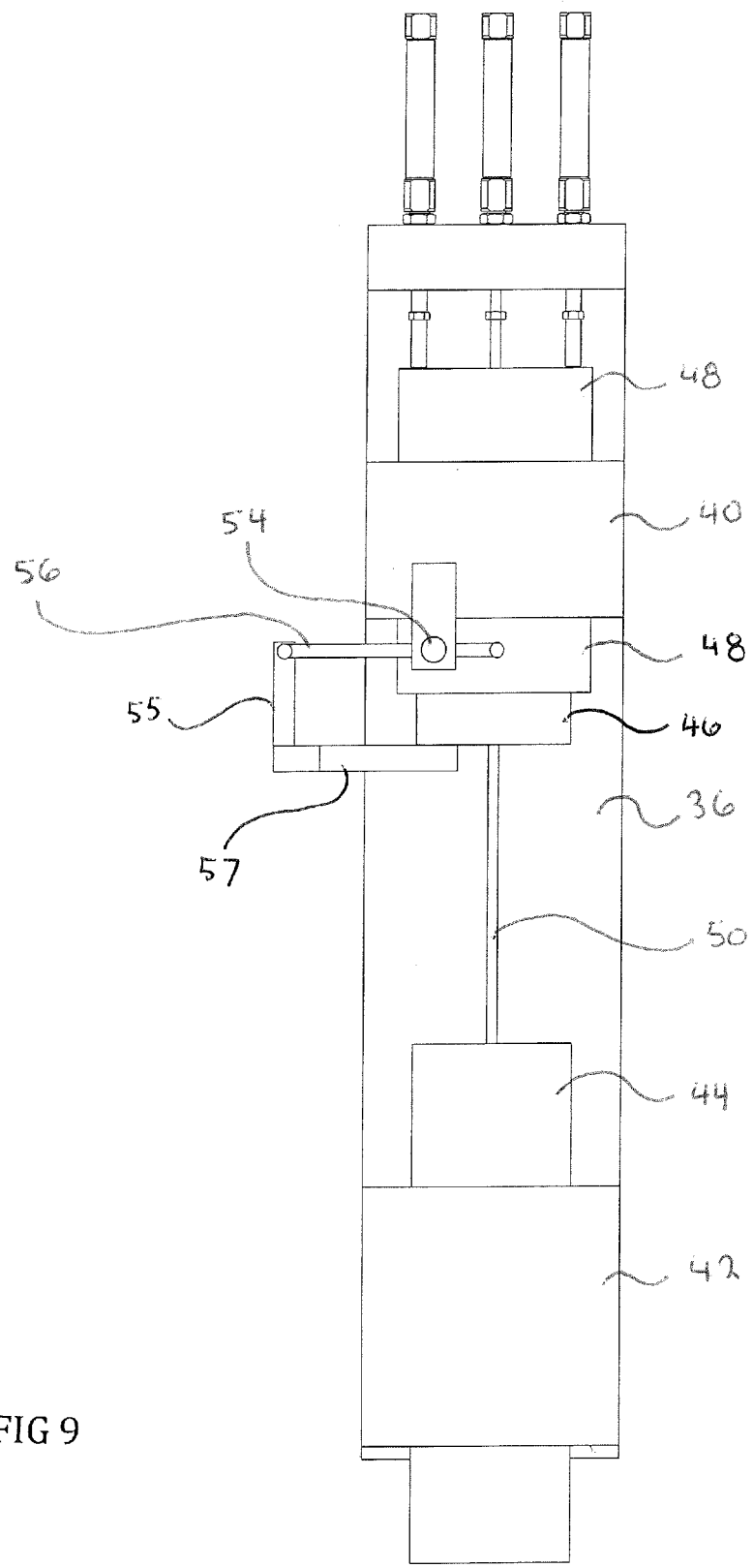
FIG. 9 is a front view of the z axis drill unit.
Figure 10:
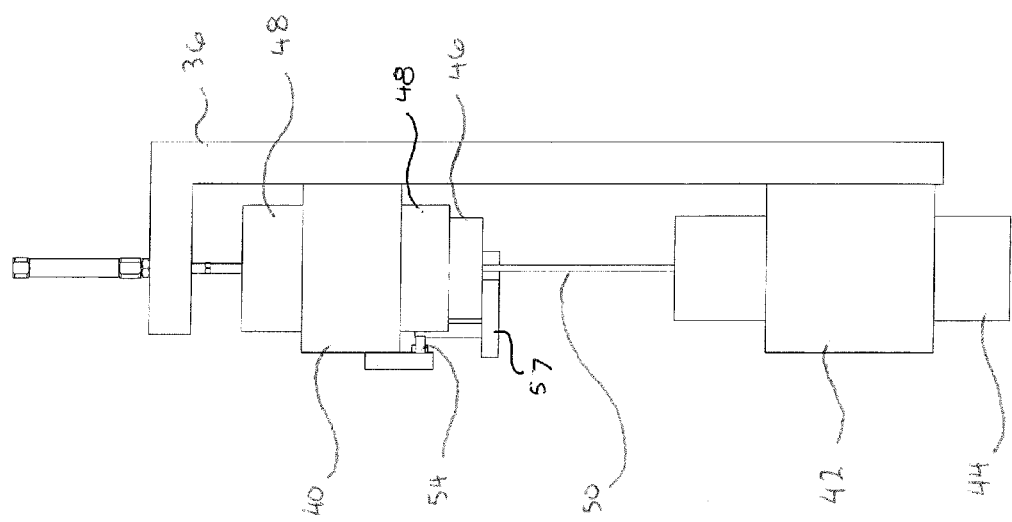
FIG. 10 is a side view of the z axis drill unit.

Looking at FIGS. 8-10 the general arrangement of the z axis balanced reactionary force drill unit 36 can best be seen. As stated earlier, for purposes of clarity the spindle rotating drive components (the drill drive equipment) and the zero impact pressure foot components that secure the PCB substrates prior to the drilling are not illustrated. Each of these are subjects of earlier patents, and are well known in this field of art and do not impose vibrational movements that are meaningful to the accuracy of the PCB substrate positioning.

The drill unit 36 is mounted and oriented on the y axis moving carriage 24 such that its linear axis and z axis drill stroke reside at 90 degrees to the horizontal plane of the x axis moving table 12 and the horizontal plane in which the y axis moving carriage travels. The drill unit 36 has a base plate 38 to which is affixed an upper guide sleeve 40 and a lower guide sleeve 42 each of which house low friction guide bushing assemblies such as 5-25 micron orificed or porous carbon air sleeves. The drill unit 36 has a spindle 44 that resides inside the low friction guide bushing assembly housed in the lower guide sleeve 42. The lower guide sleeve also houses the spindle motor. The spindle 44 holds a drill bit and is rotated at a high speed. The spindle 44 is driven or plunged downward in the z axis by a z axis spindle drive unit that applies an electric pulse that is provided to the voice coil 46 which is of a cup shaped design that fits up into a mating recess in the bottom of the voice coil magnet assembly 48. The voice coil magnet assembly 48 is made of a voice coil magnet that is coupled to a reaction mass and is partially housed within a low friction guide bushing assembly housed within the upper guide sleeve 40. There is a slender linear member flexure 50 connecting the spindle 44 to the voice coil 46. This flexure 50 deflects slightly to keep any angular distortion or deviance from the z axis travel of the spindle 44 minimized.

This conjoined voice coil magnet and reaction mass (voice coil magnet assembly) 48 has a mass several times greater than that of the voice coil 46, flexure 50 and spindle 44 combined. In this manner, when the electric pulse is sent to the voice coil 46 which resides partially within the recess in the bottom of the voice coil magnet, the magnetic field generated in the voice coil 46 pushes against the magnetic field of the voice coil magnet and reaction mass 48, and because the mass of the voice coil 46, flexure 50 and spindle 44 combination is much lesser than the mass of the voice coil magnet and reaction mass 48, the combination of the voice coil 46, flexure 50 and spindle 44 are driven downwards in the z axis. Simultaneously, the magnet and reaction mass 48 are driven upwards in the z axis. The ratio of the length of the upwards stroke of the voice coil magnet and reaction mass 48 to the length of the downwards stroke of the voice coil 46, flexure 50 and spindle 44 is proportional to their masses. If the mass of the voice coil magnet and reaction mass 48 is 10 times that of the voice coil 46, flexure 50 and spindle 44 combined, then for every one inch of spindle motion in the negative z axis there will be a reactionary 0.1 inch movement of the magnet and reaction mass 48 in the positive z axis and vice versa. Since the reactionary force movement created when the spindle 44 plunges its bit downward into the PCB substrate is dealt with by the opposing (balancing) movement of the magnet and reaction mass 48 upwards, there is no unresolved forces or movement passed onto the drill unit 36 and the metrology frame base 20. Thus, there are no unresolved reactionary forces to disturb either the position feed back sensors or the drilling geometry of the spindle 44.

Additionally, to aid in the minimizing of the reactionary forces, and to ensure that the spindle and magnet always return or "settle" to the same position, a multi axis pivotable phase linkage 52 is connected between the voice coil 46 and the voice coil magnet assembly 48. This phase linkage is made of a series of sequentially connected linear members. In FIG. 9 the first member 56 (which is a linear arm) has a distal pivotal connection 53 to the voice coil 46 and a proximate pivotal connection to a first end of an intermediate connection member 55. A stationary pivot 54 is affixed to the bottom of the upper guide sleeve 40 and is aligned on the linear axis of the spindle 44. The first member 56 passes horizontally through the pivot 54 such that the ratio of the distance from the pivot 54 to the distal pivotal connection 53 compared to the distance from the pivot 54 to the proximate pivotal connection 56, is the same ratio as that of the mass of the voice coil magnet and reaction mass 48 to that of the mass of the voice coil 46, flexure 50 and spindle 44 combined. The second end of the intermediate connection member 55 is connected to the last connection member 57 which is affixed to the voice coil 46.

It is to be noted that the voice coil 46 and said voice coil magnet coupled to said reaction mass 48 each simultaneously move in opposite directions along the z axis. Since the mass of said voice coil 46, spindle 44 and said flexure 50 is less than a mass of said voice coil magnet coupled to said reaction mass 48, the amount of their linear movements are in proportion to their masses. For example, if the combined mass of the voice coil 46, spindle 44 and said flexure 50 is 100 grams and the combined mass of said voice coil magnet coupled to said reaction mass 48 is 1000 grams, then the voice coil 46, spindle 44 and said flexure 50 will move 10 times further and in the opposite z axis direction than the voice coil magnet coupled to said reaction mass 48 will move.

The decoupled force frame/metrology frame design in conjunction with the balanced reactionary force drill unit attempt to bring all of the net reactionary forces derived form the positioning and drilling functions of the apparatus to zero within the metrology frame so as to allow much more efficient operation of the feedback sensors. This in turn increases the throughput of the device by allowing shorter sensor settle times, higher drill cycle times, more accurate drilling geometry, less broken bits and a longer bit life.

The above description will enable any person skilled in the art to make and use this invention. It also sets forth the best modes for carrying out this invention. There are numerous variations and modifications thereof that will also remain readily apparent to others skilled in the art, now that the general principles of the present invention have been disclosed. As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

We claim:

1. A PCB substrate drilling apparatus comprising:
a base mass force frame;
a meterology frame support base;
at least one isolation dampener;
an x axis linear drive unit having an x axis stationary drive track and a driveable, x axis traveling arm;
a y axis linear drive unit having a y axis stationary drive track and a driveable y axis traveling arm,
a positionable x axis moving table assembly coupled to said x axis traveling arm and wherein said moving table assembly is moveably supported on said meterology frame support base;
a positionable y axis moving carriage coupled to said y axis traveling arm wherein said y axis moving carriage is moveably supported on an extension of said meterology frame support base;
at least one z axis drill unit coupled to said y axis moving carriage;
an x axis reactionary force movement transfer means that supports said x axis stationary drive track and is an extension of said base mass force frame; and
a y axis reactionary force movement transfer means that supports said y axis stationary drive track and is an extension of said base mass force frame;
wherein said meterology frame support base and said base mass force frame are separated by at least one of said isolation dampeners.

2. The PCB substrate drilling apparatus of claim 1 further comprising at least one vibration isolation dampener positioned between said base mass force frame and said metrology frame support base.

3. The PCB substrate drilling apparatus of claim 1 wherein said z axis drill unit is a balanced reactionary force drill unit that comprises:
drill unit base plate connected to said moving carriage;
a z axis moveable drill spindle rotationally housed in a first guide bushing assembly that is mounted in a lower guide sleeve affixed to said drill unit base plate;
a z axis moveable spindle drive unit moveably housed in a second guide bushing assembly that is mounted in an upper guide sleeve affixed to said drill unit base plate;
a flexure connector affixed between said spindle and said z axis spindle drive unit.

4. The PCB substrate drilling apparatus of claim 3 wherein said z axis spindle drive unit comprises a voice coil moveably housed within a portion of a moveable voice coil magnet coupled to a reaction mass.

5. The PCB substrate drilling apparatus of claim 4 wherein said spindle and said flexure combined have a first mass, and said voice coil magnet and coupled reaction mass combined have a second mass, and wherein said first mass is less than said second mass.

6. The PCB substrate drilling apparatus of claim 5 wherein said z axis drill unit has a series of sequentially joined connection members forming a pivotable phase linkage, wherein a first connection member is pivotally affixed to said voice coil magnet and a last connection member is affixed to said voice coil, and wherein said first connection member also is affixed to the bottom of said upper guide sleeve by a pivot support that extends from said upper guide sleeve and is aligned along a linear axis of the spindle, wherein said first connection member passes horizontally through said pivot and the ratio of the distance from said pivot to a distal end of said first connection member compared to the distance from said pivot to a proximate end of said first connection member approximates the ratio of a combined mass of the magnet and the reaction mass to a combined mass of the voice coil, the flexure and the spindle.

7. The PCB substrate drilling apparatus of claim 2 wherein said at least one vibration isolation dampener has an upper contact point on said metrology frame support base and a lower contact point on said base mass force frame and wherein said upper contact point lies along a center of gravity plane for said metrology frame support base.

8. The PCB substrate drilling apparatus of claim 6 further comprising an intermediate connection member connected between said first connection member and said last connection member.

9. A PCB substrate drilling apparatus comprising:
a supporting base;
an x axis linear drive unit residing on said supporting base and having an x axis stationary drive track and an x axis traveling arm;
a y axis linear drive unit residing on said supporting base and having a y axis stationary drive track and a y axis traveling arm;
a positionable x axis moving table assembly coupled to said x axis traveling arm;
a positionable y axis moving carriage coupled to said y axis traveling arm;
a z axis balanced reactionary force drill unit coupled to said y axis moving carriage, wherein said z axis reactionary force drill unit comprises a drill unit base plate connected to said moving carriage,
a z axis moveable drill spindle rotationally housed in a first guide bushing assembly that is mounted in a lower guide sleeve affixed to said drill unit base plate;
a z axis spindle drive unit comprised of a voice coil and a voice coil magnet coupled to a reaction mass wherein said voice coil is partially housed within a recess in said voice coil magnet, and wherein said z axis spindle drive unit is moveably housed in a second guide bushing assembly that is mounted in an upper guide sleeve affixed to said drill unit base plate,
wherein said voice coil and said voice magnet coupled to said reaction mass are each simultaneously moveable in opposite directions along the z axis;
wherein a mass of said voice coil, said spindle and a flexure is less than a mass of said voice coil magnet coupled to said reaction mass; and
said flexure connector affixed between said spindle and said z axis spindle drive unit;
wherein said z axis drill unit has a series of sequentially joined connection members forming a pivotable phase linkage, wherein a first connection member is pivotally affixed to said voice coil magnet and a last connection member is affixed to said voice coil, and wherein said first connection member also is affixed to the bottom of said upper guide sleeve by a pivot support that extends from said upper guide sleeve and is aligned along a linear axis of the spindle, wherein said first connection member passes horizontally through said pivot and the ratio of the distance from said pivot to a distal end of said first connection member compared to the distance from said pivot to a proximate end of said first connection member approximates the ratio of a combined mass of the magnet and the reaction mass to a combined mass of the voice coil, the flexure and the spindle.

10. The PCB substrate drilling apparatus of claim 9 wherein said supporting base is comprised of:
a metrology frame support base;
a base mass force frame; and
at least one compressive isolation dampener;
wherein said meterology frame support base resides atop of said base mass force frame but separated by said base mass force frame by at least one of said compressive isolation dampeners.

11. The PCB substrate drilling apparatus of claim 9 wherein said x axis stationary drive track and said y axis stationary drive track are affixed to said base mass force frame, and said x axis travelling arm is connected to said moving table assembly that is moveably supported on said meterology frame support base, and said y axis travelling arm is connected to a said moving carriage that is moveably supported on said meterology frame support base.

12. The PCB substrate drilling apparatus of claim 10 wherein said x axis stationary drive track is affixed to said base mass force by an x axis reactionary force movement transfer means, and said y axis stationary drive track are affixed to said base mass force frame by a y axis reactionary force movement transfer means.

13. The PCB substrate drilling apparatus of claim 11 wherein said vibration isolation dampener has an upper contact point on said metrology frame support base and a lower contact point on said base mass force frame and wherein said upper contact point lies along a center of gravity plane for said metrology frame support base.

14. The PCB substrate drilling apparatus of claim 13 wherein said metrology frame support base has a stopped vertical orifice defined therein having an upper face that resides parallel to said center of gravity plane and contacts said at least one vibration isolation dampener's upper contact point.

* * * * *